United States Patent
Ueta

(10) Patent No.: US 12,227,876 B2
(45) Date of Patent: Feb. 18, 2025

(54) SILICON CARBIDE SINGLE CRYSTAL AND SILICON CARBIDE SUBSTRATE

(71) Applicant: SUMITOMO ELECTRIC INDUSTRIES, LTD., Osaka (JP)

(72) Inventor: Shunsaku Ueta, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 18/575,557

(22) PCT Filed: Jun. 15, 2022

(86) PCT No.: PCT/JP2022/023982
§ 371 (c)(1),
(2) Date: Dec. 29, 2023

(87) PCT Pub. No.: WO2023/282000
PCT Pub. Date: Jan. 12, 2023

(65) Prior Publication Data
US 2024/0309555 A1    Sep. 19, 2024

(30) Foreign Application Priority Data
Jul. 8, 2021    (JP) .................................. 2021-113365

(51) Int. Cl.
*C30B 29/36* (2006.01)

(52) U.S. Cl.
CPC .................................... *C30B 29/36* (2013.01)

(58) Field of Classification Search
CPC ...................................................... C30B 29/36
See application file for complete search history.

(56) References Cited

FOREIGN PATENT DOCUMENTS

| JP | 11-255597 A | 9/1999 |
| JP | 2008-214146 A | 9/2008 |
| JP | 2014-028757 A | 2/2014 |
| JP | 2018-83733 A | 5/2018 |

*Primary Examiner* — Elizabeth E Mulvaney
(74) *Attorney, Agent, or Firm* — Renner, Otto, Boisselle & Sklar, LLP

(57) ABSTRACT

A middle cross-section includes a dense region in which an area density of threading screw dislocations is 2 or more times an overall average area density. An area of the dense region is 10% or less of an area of the middle cross-section. A line density of a stacking fault in each of a first and a second cross-sections is 1/cm or less, the first cross-section being separated from a first boundary toward a second boundary by a distance of 0.1 times a distance between the first and second boundaries, the second cross-section being a cross-section separated from the second boundary toward the first boundary by a distance of 0.1 times the distance between the first and second boundaries. The middle cross-section includes a sparse density region in which an area density of threading screw dislocations is lower than half the overall average area density.

10 Claims, 11 Drawing Sheets

SILICON CARBIDE SINGLE CRYSTAL AND SILICON CARBIDE SUBSTRATE

TECHNICAL FIELD

The present disclosure relates to a silicon carbide single crystal and a silicon carbide substrate. This application claims priority based on Japanese Patent Application No. 2021-113365 filed on Jul. 8, 2021, and the entire contents of the Japanese patent application are incorporated herein by reference.

BACKGROUND ART

Japanese Unexamined Patent Application Publication No. 2014-28757 (PTL 1) describes a method for producing a silicon carbide single crystal with partially reduced screw dislocation.

CITATION LIST

Patent Literature

PTL 1: Japanese Unexamined Patent Application Publication No. 2014-28757

SUMMARY OF THE INVENTION

A silicon carbide single crystal according to the present disclosure includes a first main surface, a second main surface opposite to the first main surface, and an outer peripheral surface contiguous to each of the first main surface and the second main surface. A middle cross-section includes a dense region in which an area density of threading screw dislocations is 2 or more times an overall average area density that is an average area density of threading screw dislocations in the middle cross-section, the middle cross-section being a cross-section perpendicular to a thickness direction of the silicon carbide single crystal and located midway between a first boundary between the first main surface and the outer peripheral surface and a second boundary between the second main surface and the outer peripheral surface. An area of the dense region is 10% or less of an area of the middle cross-section. A line density of a stacking fault in each of a first cross-section and a second cross-section is 1/cm or less, the first cross-section being a cross-section separated from the first boundary toward the second boundary by a distance of 0.1 times a distance from the first boundary to the second boundary, the second cross-section being a cross-section separated from the second boundary toward the first boundary by a distance of 0.1 times the distance from the first boundary to the second boundary. The middle cross-section includes a sparse density region in which an area density of threading screw dislocations is lower than half the overall average area density. An area of the sparse density region is 12% or more of the area of the middle cross-section.

A silicon carbide substrate according to the present disclosure includes a main surface. The main surface includes a dense region in which an area density of threading screw dislocations is 2 or more times an overall average area density that is an average area density of threading screw dislocations in the main surface. An area of the dense region is 10% or less of an area of the main surface. A line density of a stacking fault in the main surface is 1/cm or less. The main surface includes a sparse density region in which an area density of threading screw dislocations is lower than half the overall average area density. An area of the sparse density region is 12% or more of the area of the main surface.

DETAILED DESCRIPTION

Figure 1:
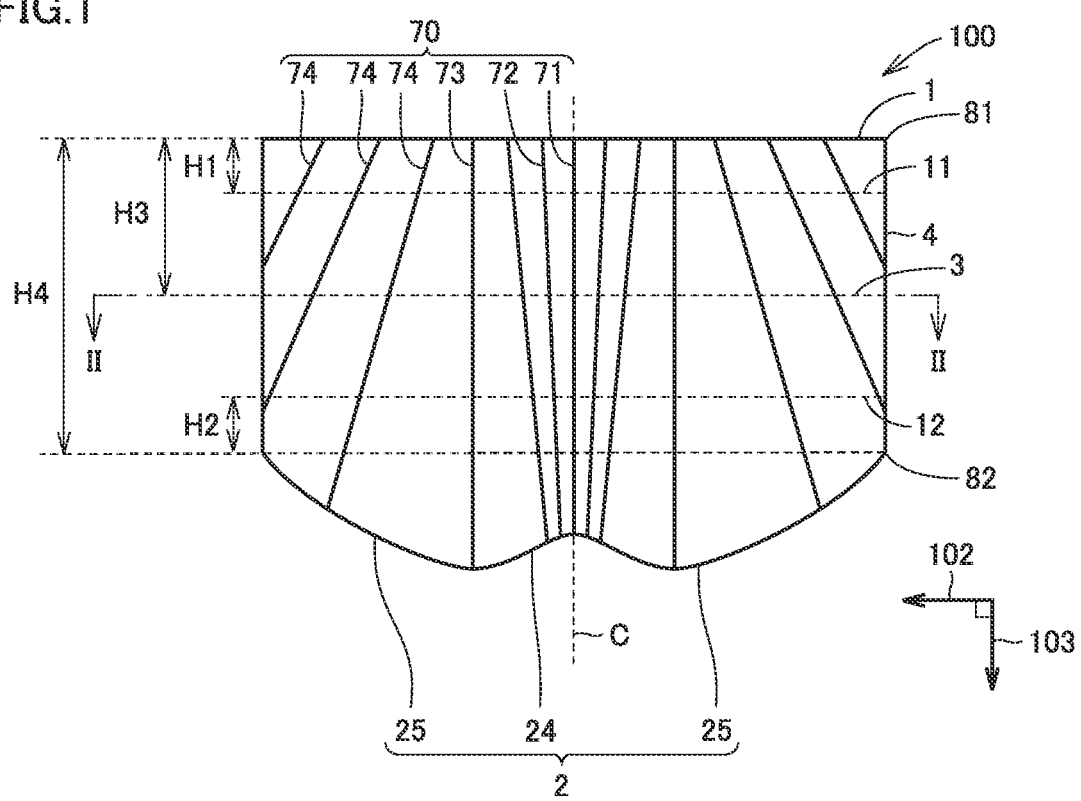
FIG. 1 is a schematic cross-sectional diagram showing a configuration of a silicon carbide single crystal according to an embodiment of the present disclosure.

Problem to be Solved by the Present Disclosure

In the above method for producing a silicon carbide single crystal, a part of screw dislocations is converted into a stacking fault by using a structure conversion layer formed at an initial stage of crystal growth. The stacking fault extends towards the outer periphery of the silicon carbide single crystal. Therefore, in the silicon carbide single crystal produced by the above method for producing the silicon carbide single crystal, a large number of screw dislocations have been present near the center and a large number of stacking faults have been present near the outer periphery. Therefore, the yield of silicon carbide semiconductor devices have not been improved.

An object of the present disclosure is to provide a silicon carbide single crystal and a silicon carbide substrate which can improve the yield of silicon carbide semiconductor devices.

Advantageous Effect of the Present Disclosure

According to the present disclosure, it is possible to provide a silicon carbide single crystal and a silicon carbide substrate capable of improving the yield of silicon carbide semiconductor devices.

Summary of Embodiments of the Present Disclosure

First, an overview of embodiments of the present disclosure will be described.

(1) A silicon carbide single crystal 100 according to the present disclosure includes a first main surface 1, a second main surface 2 opposite to first main surface 1, and an outer peripheral surface 4 contiguous to each of first main surface 1 and the second main surface. A middle cross-section 3 includes a dense region 55 in which an area density of threading screw dislocations 70 is 2 or more times an overall average area density that is an average area density of threading screw dislocations 70 in middle cross-section 3, middle cross-section 3 being a cross-section perpendicular to a thickness direction of silicon carbide single crystal 100 and located midway between a first boundary 81 between first main surface 1 and outer peripheral surface 4 and a second boundary 82 between second main surface 2 and outer peripheral surface 4. An area of dense region 55 is 10% or less of an area of middle cross-section 3. A line density of a stacking fault 5 in each of a first cross-section 11 and a second cross-section 12 is 1/cm or less, the first cross-section being a cross-section separated from first boundary 81 toward second boundary 82 by a distance of 0.1 times a distance from first boundary 81 to second boundary 82, the second cross-section being a cross-section separated from second boundary 82 toward first boundary 81 by a distance of 0.1 times the distance from first boundary 81 to second boundary 82. Middle cross-section 3 includes a sparse density region 58 in which an area density of threading screw dislocations 70 is lower than half the overall average area density. An area of sparse density region 58 is 12% or more of the area of middle cross-section 3.

(2) In silicon carbide single crystal 100 according to (1) above, dense region 55 may include a center of middle cross-section 3.

(3) In silicon carbide single crystal 100 according to (1) or (2) above, the area of sparse density region 58 may be 30% or more of the area of middle cross-section 3.

(4) In silicon carbide single crystal 100 according to any one of (1) to (3) above, middle cross-section 3 may include an annular region 57 between a first circle 51 having a diameter of 40% of a diameter of middle cross-section 3 and a second circle 52 having a diameter of 60% of the diameter of middle cross-section 3. Each of a center of first circle 51 and a center of second circle 52 may be identical to a center of middle cross-section 3. An average area density of threading screw dislocations 70 in annular region 57 may be 1.3 or more times the overall average area density.

(5) In silicon carbide single crystal 100 according to any one of (1) to (4) above, middle cross-section 3 may have a diameter of 150 mm or more.

(6) A silicon carbide substrate 10 according to the present disclosure includes a main surface 61. Main surface 61 includes a dense region 55 in which an area density of threading screw dislocations 70 is 2 or more times an overall average area density that is an average area density of threading screw dislocations 70 in main surface 61. An area of dense region 55 is 10% or less of an area of main surface 61. A line density of stacking fault 5 in main surface 61 is 1/cm or less. Main surface 61 includes a sparse density region 58 in which an area density of threading screw dislocations 70 is lower than half the overall average area density. An area of sparse density region 58 is 12% or more of the area of main surface 61.

(7) In silicon carbide substrate 10 according to (6) above, dense region 55 may include a center of main surface 61.

(8) In silicon carbide substrate 10 according to (6) or (7) above, the area of sparse density region 58 may be 30% or more of the area of main surface 61.

(9) In silicon carbide substrate 10 according to any one of (6) to (8) above, main surface 61 may include an annular region 57 between a first circle 51 having a diameter of 40% of a diameter of main surface 61 and a second circle 52 having a diameter of 60% of the diameter of main surface 61. Each of a center of first circle 51 and a center of second circle 52 may be identical to a center of main surface 61. An average area density of threading screw dislocations 70 in annular region 57 may be 1.3 or more times the overall average area density.

(10) In silicon carbide substrate 10 according to any one of (6) to (9) above, main surface 61 may have a diameter of 150 mm or more.

Details of Embodiments of Present Disclosure

Details of embodiments of the present disclosure (hereinafter also referred to as the embodiments) will be described below with reference to the drawings. In the following drawings, the same or corresponding portions are denoted by the same reference numerals, and description thereof will not be repeated.

First, a configuration of a silicon carbide single crystal 100 according to an embodiment will be described. FIG. 1 is a schematic cross-sectional diagram showing a configuration of silicon carbide single crystal 100 according to the embodiment. As shown in FIG. 1, silicon carbide single crystal 100 according to the embodiment has a first main surface 1, a second main surface 2, and an outer peripheral surface 4. Second main surface 2 is opposite to first main surface 1. Outer peripheral surface 4 is contiguous to each of first main surface 1 and second main surface 2. Outer peripheral surface 4 is, for example, a cylindrical surface. Outer peripheral surface 4 surrounds a central axis C of silicon carbide single crystal 100. First main surface 1 has a planar shape, for example.

First main surface 1 is, for example, the {0001} plane or a plane inclined by an off angle with respect to the {0001} plane. Specifically, first main surface 1 may be the (0001) plane or a plane inclined by an off angle with respect to the (0001) plane, or first main surface 1 may be the (000-1) plane or a plane inclined by an off angle with respect to the (000-1) plane. The off angle may be, for example, 5° or less or may be 3° or less. The off direction may be, for example, a <11-20> direction.

First main surface 1 extends along each of a first direction 101 and a second direction 102. First direction 101 is, for example, the <1-100> direction. Second direction 102 is, for example, the <11-20> direction. A thickness direction of silicon carbide single crystal 100 is referred to as a third direction 103. Third direction 103 is, for example, the <0001> direction. Third direction 103 may be a direction inclined by an off angle with respect to the <0001> direction. Third direction 103 is the same as the growth direction of silicon carbide. Third direction 103 may be perpendicular to first main surface 1. Central axis C of silicon carbide single crystal 100 extends along third direction 103.

Second main surface 2 includes a central region 24 and an outer peripheral region 25. In a direction perpendicular to central axis C, outer peripheral region 25 is located outside central region 24. Outer peripheral region 25 surrounds central region 24. Central region 24 may be curved so as to be depressed inward. In other words, central region 24 may be curved so as to be recessed toward first main surface 1. Outer peripheral region 25 may be curved so as to project outward. In other words, outer peripheral region 25 may be curved so as to protrude toward the opposite to first main surface 1.

A thickness (a fourth thickness H4) of silicon carbide single crystal 100 according to the embodiment of the present disclosure is, for example, from 1 mm to 100 mm. The lower limit of fourth thickness H4 is not particularly limited, and may be, for example, 5 mm or more, or 10 mm or more. The upper limit of fourth thickness H4 is not particularly limited, and may be, for example, 80 mm or less, or 60 mm or less. The boundary between first main surface 1 and outer peripheral surface 4 is referred to as a first boundary 81. The boundary between second main surface 2 and outer peripheral surface 4 is referred to as a second boundary 82. Fourth thickness H4 is a distance from first boundary 81 to second boundary 82. In other words, fourth thickness H4 is the thickness of silicon carbide single crystal 100 at the thinnest portion.

A cross-section perpendicular to the thickness direction of silicon carbide single crystal 100 and located midway between first boundary 81 and second boundary 82 is referred to as a middle cross-section 3. In third direction 103, a distance (a third distance H3) between first main surface 1 and middle cross-section 3 is half of fourth thickness H4. A cross-section separated from first boundary 81 toward second boundary 82 by a distance of 0.1 times of a distance from first boundary 81 to second boundary 82 is referred to as a first cross-section 11. In other words, in third direction 103, a distance (a first distance H1) between first boundary 81 and first cross-section 11 is 10% of the thickness of silicon carbide single crystal 100. A cross-section separated from second boundary 82 toward first boundary 81 by a distance of 0.1 times the distance from first boundary 81 to second boundary 82 is referred to as a second cross-section 12. In other words, a distance (a second distance H2) between second boundary 82 and second cross-section 12 in third direction 103 is 10% of the thickness of silicon carbide single crystal 100.

As shown in FIG. 1, silicon carbide single crystal 100 has a plurality of threading screw dislocations 70. The plurality of threading screw dislocations 70 include, for example, a first threading screw dislocation 71, a second threading screw dislocation 72, a third threading screw dislocation 73, and a fourth threading screw dislocation 74. First threading screw dislocation 71 extends, for example, along third direction 103. First threading screw dislocation 71 may extend along central axis C. First threading screw dislocation 71 may be located at the center of first main surface 1. First threading screw dislocation 71 is exposed to each of first main surface 1 and second main surface 2. Third threading screw dislocation 73 may be parallel to first threading screw dislocation 71. Third threading screw dislocation 73 may extend along third direction 103. Third threading screw dislocation 73 is spaced apart from the center of first main surface 1. Third threading screw dislocation 73 is exposed to each of first main surface 1 and second main surface 2.

As shown in FIG. 1, second threading screw dislocation 72 is inclined relative to central axis C. Second threading screw dislocation 72 approaches central axis C as silicon carbide single crystal 100 grows. In other words, a distance between second threading screw dislocation 72 and central axis C in a direction perpendicular to third direction 103 decreases from first main surface 1 to second main surface 2. A distance between second threading screw dislocation 72 and central axis C on first main surface 1 is greater than a distance between second threading screw dislocation 72 and central axis C on second main surface 2. Second threading screw dislocation 72 is exposed to each of first main surface 1 and second main surface 2.

As shown in FIG. 1, fourth threading screw dislocation 74 is inclined with respect to central axis C. Fourth threading screw dislocation 74 moves away from central axis C as silicon carbide single crystal 100 grows. In other words, a distance between fourth threading screw dislocation 74 and central axis C in the direction perpendicular to third direction 103 increases from first main surface 1 to second main surface 2. A distance between fourth threading screw dislocation 74 and central axis C on first main surface 1 is smaller than a distance between second threading screw dislocation 72 and central axis C on second main surface 2. Fourth threading screw dislocation 74 is exposed to each of first main surface 1 and second main surface 2. Fourth threading screw dislocation 74 may be exposed to outer peripheral surface 4.

Figure 2:
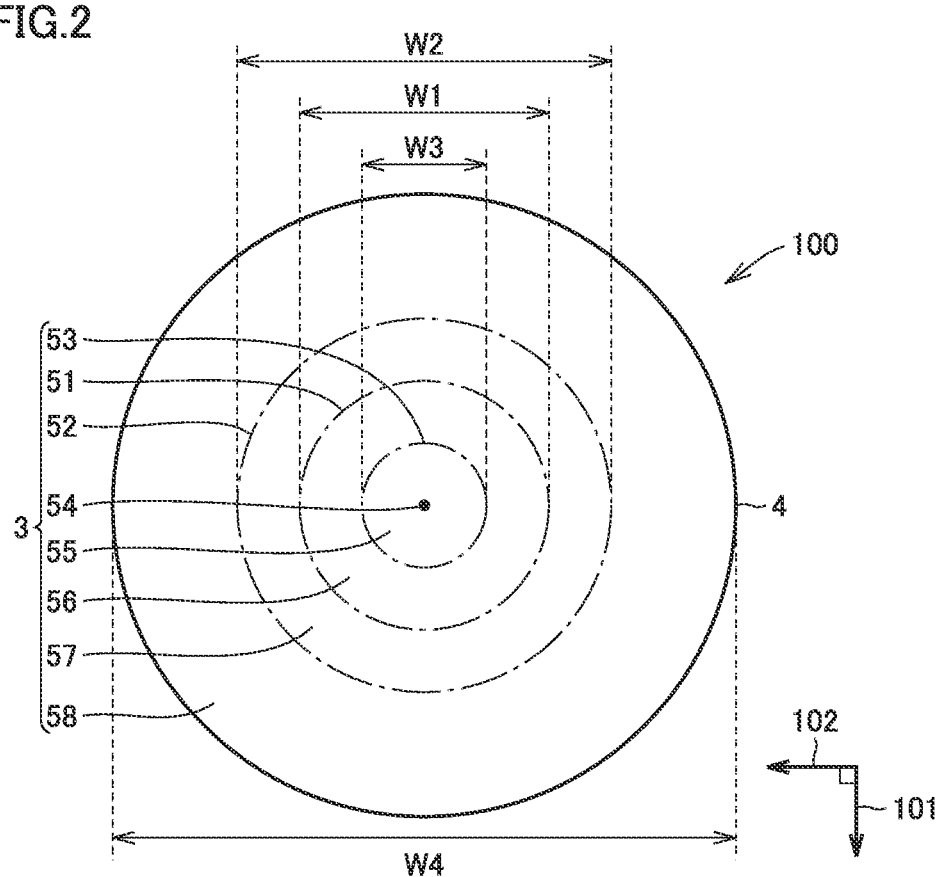
FIG. 2 is a schematic cross-sectional diagram taken along line II-II of FIG. 1.

FIG. 2 is a schematic cross-sectional diagram taken along line II-II of FIG. 1. The cross-section shown in FIG. 2 is middle cross-section 3 located midway between first main surface 1 and second main surface 2. Middle cross-section 3 has a substantially circular shape. Middle cross-section 3 is perpendicular to third direction 103. Assuming that the diameter of middle cross-section 3 is a fourth diameter W4, fourth diameter W4 is, for example, 150 mm. The lower limit of fourth diameter W4 is not particularly limited, and may be, 150 mm or more, or 200 mm or more, for example. The upper limit of fourth diameter W4 is not particularly limited, and may be, 300 mm or less, or 250 mm or less, for example.

As shown in FIG. 2, middle cross-section 3 includes, for example, a dense region 55, a non-dense region 56, an annular region 57, and a sparse density region 58. Assuming that an average area density of threading screw dislocations 70 in middle cross-section 3 is an overall average area density, dense region 55 has an area density of threading screw dislocations 70 of 2 or more times an overall average area density. In other words, the area density of threading screw dislocation 70 in dense region 55 is 2 or more times the overall average area density. Dense region 55 may include a center 54 of middle cross-section 3.

An area of dense region 55 is 10% or less of an area of middle cross-section 3. The upper limit value of the area of dense region 55 is not particularly limited, and may be, for example, 9% or less of the area of middle cross-section 3, or 8% or less of the area of middle cross-section 3. The lower limit value of the area of dense region 55 is not particularly limited, but may be, for example, 1% or more of the area of middle cross-section 3, or 2% or more of the area of middle cross-section 3.

An outer shape of dense region 55 may be circular. The outer shape of dense region 55 is referred to as a third circle 53. A diameter of third circle 53 is referred to as a third diameter W3. The upper limit of third diameter W3 is not particularly limited, and may be, for example, 0.3 or less times, or 0.25 or less times fourth diameter W4. The lower limit of third diameter W3 is not particularly limited, but may be, for example, 0.1 or more times, or 0.2 or more times fourth diameter W4.

Non-dense region 56 is located outside dense region 55. Non-dense region 56 may surround dense region 55. Non-dense region 56 has an area density of threading screw dislocations 70 that is less than twice the overall average area density. In other words, the area density of non-dense region 56 is less than twice the overall average area density.

As shown in FIG. 2, annular region 57 is between a first circle 51 and a second circle 52. Assuming that a diameter of first circle 51 is a first diameter W1, first diameter W1 has a diameter of 40% of the diameter of middle cross-section 3. Assuming that a diameter of second circle 52 is a second diameter W2, second diameter W2 has a diameter of 60% of the diameter of middle cross-section 3. Each of the center of first circle 51 and the center of second circle 52 is identical to the center of middle cross-section 3.

An average area density of threading screw dislocations 70 in annular region 57 is 1.3 or more times the overall average area density. The lower limit value of the average area density of threading screw dislocations 70 in annular region 57 is not particularly limited, but may be 1.35 or more times or 1.4 or more times the overall average area density. The upper limit value of the average area density of threading screw dislocations 70 in annular region 57 is not particularly limited, but may be 1.9 or less times or 1.8 or less times the overall average area density.

Sparse density region 58 has an area density of threading screw dislocations 70 that is lower than half the overall average area density. Sparse density region 58 is located outside dense region 55, for example. Sparse density region 58 is located outside second circle 52, for example. Sparse density region 58 may be separated from annular region 57. Sparse density region 58 may surround annular region 57.

An area of sparse density region 58 may be 12% or more of the area of middle cross-section 3. The lower limit of the area of sparse density region 58 is not particularly limited, but may be, for example, 20% or more of the area of middle cross-section 3, 25% or more of the area of middle cross-section 3, 30% or more of the area of middle cross-section 3, or 35% or more of the area of middle cross-section 3. The upper limit of the area of sparse density region 58 is not particularly limited, but may be, for example, 60% or less of the area of middle cross-section 3, or 50% or less of the area of middle cross-section 3.

Figure 3:
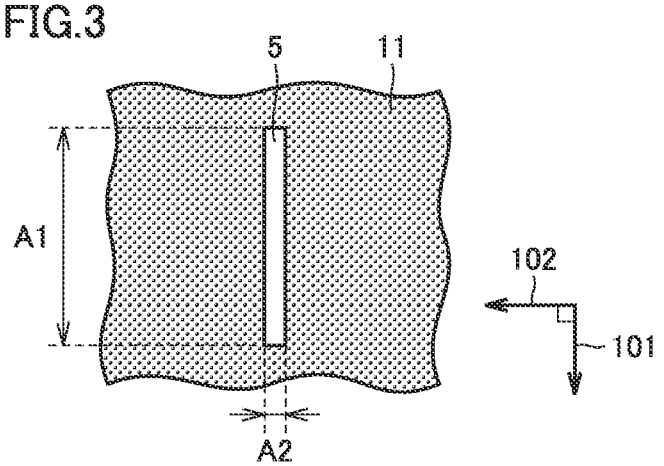
FIG. 3 is an enlarged schematic view of a portion showing a photoluminescence image of a first cross-section.

FIG. 3 is an enlarged schematic view of a portion showing a photoluminescence image of first cross-section 11. Silicon carbide single crystal 100 according to the embodiment has a stacking fault 5. Stacking fault 5 may extend along the {0001} plane. Stacking fault 5 may extend from first main surface 1. As shown in FIG. 3, stacking fault 5 is exposed on first cross-section 11. First main surface 1 may be inclined in the off direction with respect to the {0001} plane. The off direction is, for example, second direction 102. When viewed in third direction 103, stacking fault 5 may extend in a direction perpendicular to second direction 102.

Second direction 102 is, for example, the <11-20> direction. First direction 101 is, for example, the <1-100> direction. As shown in FIG. 3, a length (a first length A1) of stacking fault 5 in first direction 101 may be longer than a length (a second length A2) of stacking fault 5 in second direction 102.

A line density of stacking fault 5 in first cross-section 11 is 1/cm or less. The upper limit of the line density of stacking fault 5 in first cross-section 11 is not particularly limited, and may be, for example, 0.9/cm or less, or 0.8/cm or less. The lower limit of the line density of stacking fault 5 in first cross-section 11 is not particularly limited, and may be, for example, 0.01/cm or more, or 0.1/cm or more.

Figure 4:
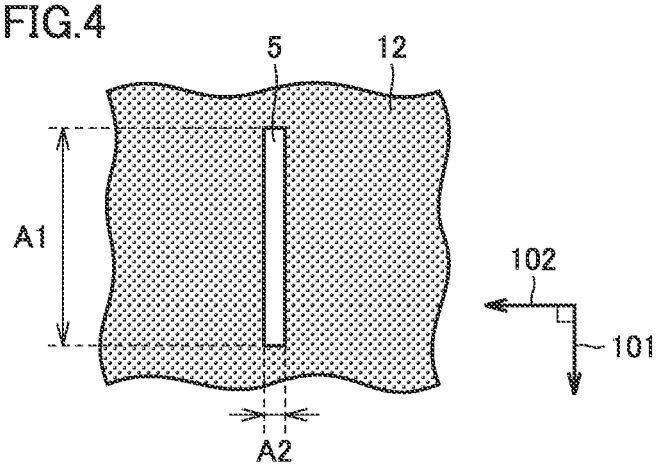
FIG. 4 is an enlarged schematic view of a portion showing a photoluminescence image of a second cross-section.

FIG. 4 is an enlarged schematic view of a portion showing a photoluminescence image of second cross-section 12. As shown in FIG. 4, stacking fault 5 may be exposed to second cross-section 12. A line density of stacking fault 5 in second cross-section 12 may be lower than the line density of stacking fault 5 in first cross-section 11.

The line density of stacking fault 5 in second cross-section 12 is 1/cm or less. The upper limit of the line density of stacking fault 5 in second cross-section 12 is not particularly limited and may be, for example, 0.9/cm or less, or 0.8/cm or less. The lower limit of the line density of stacking fault 5 in second cross-section 12 is not particularly limited, and may be, for example, 0.01/cm or more, or 0.1/cm or more.

Figure 5:
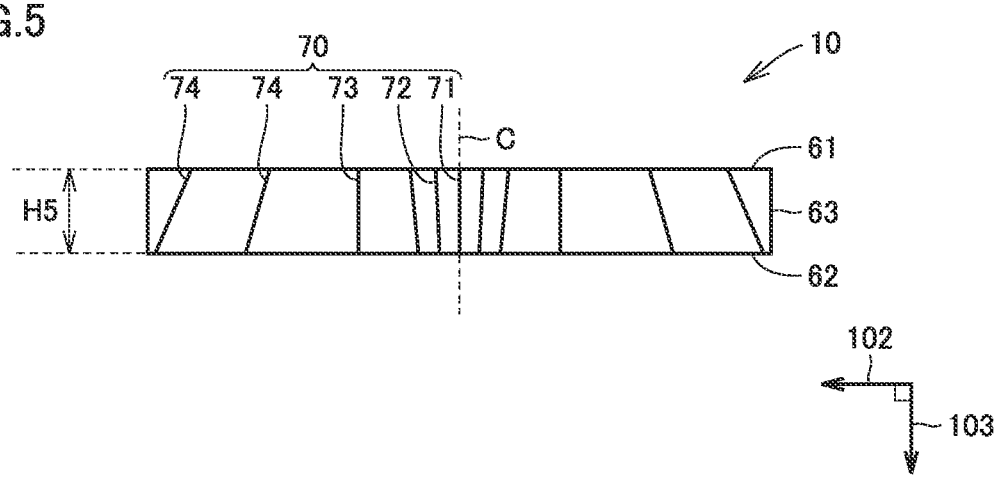
FIG. 5 is a schematic cross-sectional diagram showing a configuration of a silicon carbide substrate according to an embodiment of the present disclosure.

Next, the configuration of a silicon carbide substrate 10 according to the embodiment will be described. FIG. 5 is a schematic cross-sectional diagram showing a configuration of silicon carbide substrate 10 according to the embodiment. As shown in FIG. 5, silicon carbide substrate 10 according to the embodiment has a third main surface 61, a fourth main surface 62, and a peripheral edge surface 63. Fourth main surface 62 is opposite to third main surface 61. Peripheral edge surface 63 is contiguous to each of third main surface 61 and fourth main surface 62. Peripheral edge surface 63 is, for example, a cylindrical surface. Peripheral edge surface 63 surrounds central axis C of silicon carbide substrate 10. Third main surface 61 has a planar shape, for example.

Third main surface 61 is, for example, the {0001} plane or a plane inclined by an off angle with respect to the {0001} plane. Specifically, third main surface 61 may be the (0001) plane or a plane inclined by an off angle with respect to the (0001) plane, or third main surface 61 may be the (000-1) plane or a plane inclined by an off angle with respect to the (000-1) plane. The off angle may be, for example, 5° or less or may be 3° or less. The off direction may be, for example, the <11-20> direction.

Third main surface 61 extends along each of first direction 101 and second direction 102. First direction 101 is, for example, the <1-100> direction. Second direction 102 is, for example, the <11-20> direction. A thickness direction of silicon carbide substrate 10 is referred to as third direction 103. Third direction 103 is, for example, the <0001> direction. Third direction 103 may be a direction inclined by the off angle with respect to the <0001> direction. Third direction 103 is the same as the growth direction of silicon carbide. Third direction 103 may be perpendicular to third main surface 61. Central axis C of silicon carbide substrate 10 extends along third direction 103. Peripheral edge surface 63 surrounds central axis C. Fourth main surface 62 may be parallel to third main surface 61.

A thickness (a fifth thickness H5) of silicon carbide substrate 10 according to the embodiment is, for example, from 100 μm to 700 μm. The lower limit of fifth thickness H5 is not particularly limited, and may be, for example, 200 μm or more, or 300 μm or more. The upper limit of fifth thickness H5 is not particularly limited, and may be, for example, 600 μm or less, or 500 μm or less. Fifth thickness H5 is the longest distance between third main surface 61 and fourth main surface 62 in third direction 103.

As shown in FIG. 5, silicon carbide substrate 10 has a plurality of threading screw dislocations 70. The plurality of threading screw dislocations 70 include, for example, first threading screw dislocation 71, second threading screw dislocation 72, third threading screw dislocation 73, and fourth threading screw dislocation 74. First threading screw dislocation 71 extends, for example, along third direction 103. First threading screw dislocation 71 may extend along central axis C. First threading screw dislocation 71 may be located at the center of third main surface 61. First threading screw dislocation 71 is exposed to each of third main surface 61 and fourth main surface 62. Third threading screw dislocation 73 may be parallel to first threading screw dislocation 71. Third threading screw dislocation 73 may extend along third direction 103. Third threading screw dislocation 73 is spaced apart from the center of third main surface 61. Third threading screw dislocation 73 is exposed to each of third main surface 61 and fourth main surface 62.

As shown in FIG. 5, second threading screw dislocation 72 is inclined relative to central axis C. Second threading screw dislocation 72 approaches central axis C as silicon carbide substrate 10 grows. In other words, the distance between second threading screw dislocation 72 and central axis C in the direction perpendicular to third direction 103 decreases from third main surface 61 to fourth main surface 62. A distance between second threading screw dislocation 72 and central axis C on third main surface 61 is greater than a distance between second threading screw dislocation 72 and central axis C on fourth main surface 62. Second threading screw dislocation 72 is exposed to each of third main surface 61 and fourth main surface 62.

As shown in FIG. 5, fourth threading screw dislocation 74 is inclined with respect to central axis C. Fourth threading screw dislocation 74 moves away from central axis C as silicon carbide substrate 10 grows. In other words, the distance between fourth threading screw dislocation 74 and central axis C in the direction perpendicular to third direction 103 increases from third main surface 61 to fourth main surface 62. A distance between fourth threading screw dislocation 74 and central axis C on third main surface 61 is smaller than a distance between second threading screw dislocation 72 and central axis C on fourth main surface 62. Fourth threading screw dislocation 74 is exposed to each of third main surface 61 and fourth main surface 62. Fourth threading screw dislocation 74 may be exposed to peripheral edge surface 63.

Figure 6:
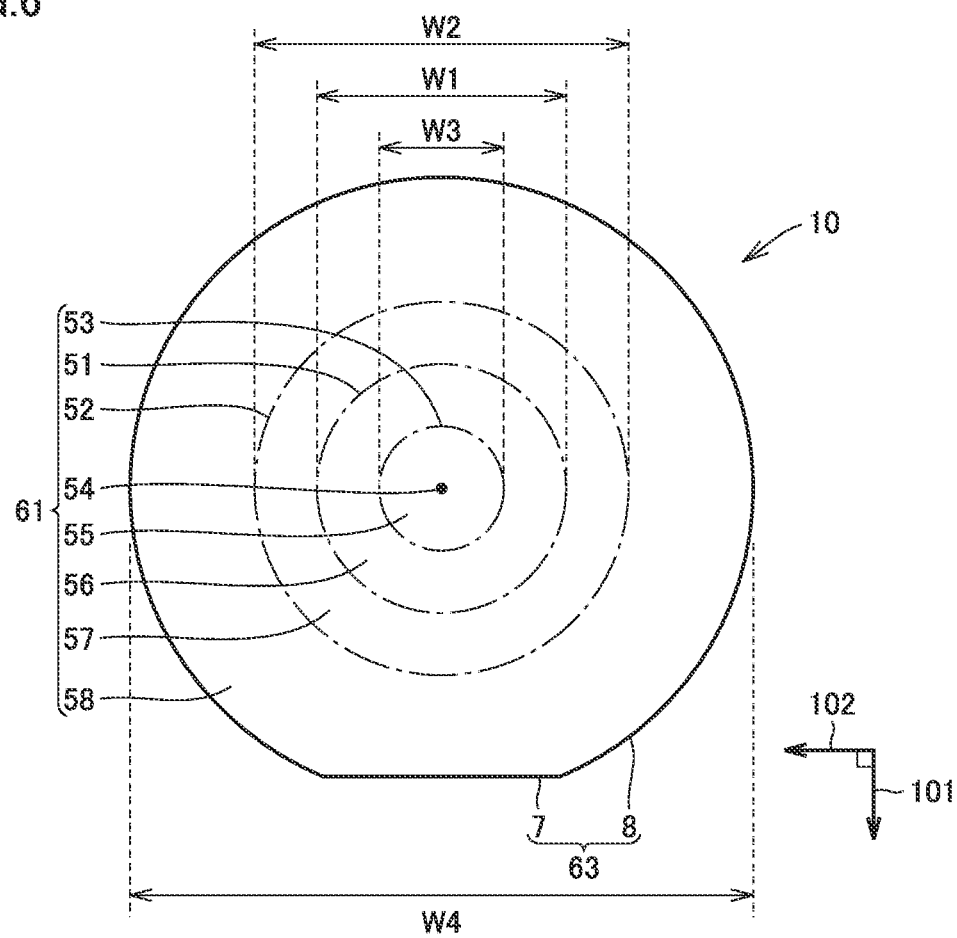
FIG. 6 is a schematic plan view showing a configuration of a third main surface of a silicon carbide substrate according to an embodiment of the present disclosure.

FIG. 6 is a schematic plan view showing a configuration of a third main surface of a silicon carbide substrate according to the embodiment. As shown in FIG. 6, peripheral edge surface 63 has an orientation flat portion 7 and an arc-shaped portion 8. Arc-shaped portion 8 is contiguous to orientation flat portion 7. As shown in FIG. 6, when viewed in third direction 103, orientation flat portion 7 extends along second direction 102.

As shown in FIG. 6, assuming that the diameter of third main surface 61 is fourth diameter W4, fourth diameter W4 is, for example, 150 mm. The lower limit of fourth diameter W4 is not particularly limited, and may be, for example, 150 mm or more, or 200 mm or more. The upper limit of fourth diameter W4 is not particularly limited, and may be, for example, 300 mm or less, or 250 mm or less. In third direction 103, fourth diameter W4 is the longest linear distance between two different points on peripheral edge surface 63.

As shown in FIG. 6, third main surface 61 has, for example, dense region 55, non-dense region 56, annular region 57, and sparse density region 58. Assuming that an average area density of threading screw dislocations 70 in third main surface 61 is an overall average area density, dense region 55 has an area density of threading screw dislocations 70 of 2 or more times the overall average area density. In other words, the area density of threading screw dislocations 70 in dense region 55 is 2 or more times the overall average area density. Dense region 55 may include center 54 of third main surface 61.

The area of dense region 55 is 10% or less of an area of third main surface 61. The upper limit value of the area of dense region 55 is not particularly limited, and may be, for example, 9% or less of the area of third main surface 61, or 8% or less of the area of third main surface 61. The lower limit value of the area of dense region 55 is not particularly limited, but may be, for example, 1% or more of the area of third main surface 61, or 2% or more of the area of third main surface 61.

The outer shape of dense region 55 may be circular. The outer shape of dense region 55 is third circle 53. The diameter of third circle 53 is third diameter W3. The upper limit of third diameter W3 is not particularly limited, and may be, for example, 0.3 or less times of fourth diameter W4, or 0.25 or less times. The lower limit of third diameter W3 is not particularly limited, but may be, for example, 0.1 or more times of fourth diameter W4, or 0.2 or more times.

Non-dense region 56 is located outside dense region 55. Non-dense region 56 may surround dense region 55. Non-dense region 56 has an area density of threading screw dislocations 70 that is less than twice the overall average area density. In other words, the area density of non-dense region 56 is less than twice the overall average area density.

As shown in FIG. 6, annular region 57 is between first circle 51 and second circle 52. Assuming that the diameter of first circle 51 is first diameter W1, first diameter W1 has a diameter of 40% of the diameter of third main surface 61. Assuming that the diameter of second circle 52 is second diameter W2, second diameter W2 has a diameter of 60% of the diameter of third main surface 61. Each of the center of first circle 51 and the center of second circle 52 is identical to the center of third main surface 61.

An average area density of threading screw dislocations 70 in annular region 57 is 1.3 or more times the overall average area density. The lower limit value of the average area density of threading screw dislocations 70 in annular region 57 is not particularly limited, but may be 1.35 or more times, or 1.4 or more times the overall average area density. The upper limit value of the average area density of threading screw dislocations 70 in annular region 57 is not particularly limited, but may be 1.9 or less times, or 1.8 or less times the overall average area density.

Sparse density region 58 has an area density of threading screw dislocations 70 that is lower than half the overall average area density. Sparse density region 58 is located outside dense region 55, for example. Sparse density region 58 is located outside second circle 52, for example. Sparse density region 58 may be separated from annular region 57. Sparse density region 58 may surround annular region 57.

The area of sparse density region 58 may be 12% or more of the area of third main surface 61. The lower limit of the area of sparse density region 58 is not particularly limited, and may be, for example, 20% or more of the area of third main surface 61, 25% or more of the area of third main surface 61, 30% or more of the area of third main surface 61, or 35% or more of the area of third main surface 61. The upper limit of the area of sparse density region 58 is not particularly limited, and may be, for example, 60% or less of the area of third main surface 61, or 50% or less of the area of third main surface 61.

Figure 7:
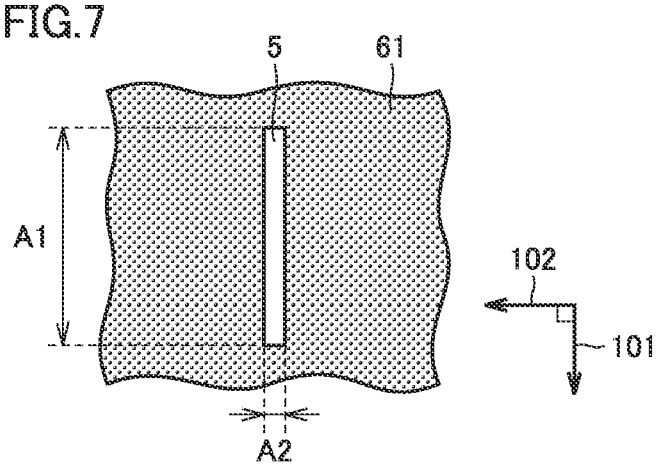
FIG. 7 is an enlarged schematic view of a portion showing a photoluminescence image of a third main surface.

FIG. 7 is an enlarged schematic view of a portion showing a photoluminescence image of third main surface 61. Silicon carbide substrate 10 according to the embodiment has stacking fault 5. Stacking fault 5 may extend along the {0001} plane. As shown in FIG. 7, stacking fault 5 is exposed on third main surface 61. Third main surface 61 may be inclined in the off direction with respect to the {0001} plane. The off direction is, for example, second direction 102. When viewed in third direction 103, stacking fault 5 may extend in a direction perpendicular to second direction 102.

Second direction 102 is, for example, the <11-20> direction. First direction 101 is, for example, the <1-100> direction. As shown in FIG. 7, the length (first length A1) of stacking fault 5 in first direction 101 may be longer than the length (second length A2) of stacking fault 5 in second direction 102.

A line density of stacking fault 5 in third main surface 61 is 1/cm or less. The upper limit of the line density of stacking fault 5 in third main surface 61 is not particularly limited, and may be, for example, 0.9/cm or less, or 0.8/cm or less. The lower limit of the line density of stacking fault 5 in third main surface 61 is not particularly limited, and may be, for example, 0.01/cm or more, or 0.1/cm or more. Stacking fault 5 may be exposed to fourth main surface 62. A line density of stacking fault 5 in fourth main surface 62 may be lower than the line density of stacking fault 5 in third main surface 61.

Next, a method for measuring the line density of stacking fault 5 will be described. In a measurement of stacking fault 5, for example, a photoluminescence imaging apparatus (model number: PLI-200) manufactured by PHOTON Design Corporation is used. When excitation light is irradiated to a measurement region for stacking fault 5, photoluminescence light is observed from the measurement region. As an excitation light source, for example, a mercury xenon lamp is used. After passing through a band-pass filter of 313 nm, the excitation light from the light sources is irradiated to the region to be measured. Photoluminescence light having wavelengths of 750 nm or more reaches a photodetector such as a camera. As described above, a photoluminescence image of the measurement region is captured.

The light emission intensity of stacking fault 5 is higher than the light emission intensity of the silicon carbide region whose polytype is 4H. Therefore, in the photoluminescence image, stacking fault 5 is displayed as a bright linear region (see FIGS. 3, 4 and 7). For example, while moving silicon carbide substrate 10 in a direction parallel to the surface to be measured (e.g., third main surface 61, first cross-section 11, or second cross-section 12), a photoluminescence image of the surface to be measured is captured. An area of one field of view of the photoluminescence image is, for example, 2.6 mm×2.6 mm. Thus, the photoluminescence image in the entire region of the surface to be measured is mapped. Stacking fault 5 is identified in the acquired photoluminescence image. A value obtained by dividing a total length of stacking faults 5 by an area of the measurement region in the surface to be measured is the line density of stacking fault 5. Here, a length of stacking fault 5 is a length (first length A1) of stacking fault 5 in the longitudinal direction (see FIG. 7). When there are a plurality of stacking faults 5, the total length of stacking faults 5 is the sum of the lengths of the plurality of stacking faults 5.

Next, a method for measuring the area density of threading screw dislocations 70 will be described. The area density of threading screw dislocations 70 is determined using, for example, molten potassium hydroxide (KOH). Specifically, the surface to be measured (e.g., third main surface 61, first cross-section 11 or second cross-section 12) is etched by molten KOH. As a result, the silicon carbide region near threading screw dislocation 70 exposed on the surface to be measured is etched to form an etch pit on the surface to be measured. The temperature of the KOH melt is, for example, from 500° C. to 550° C. The etching time is from 5 minutes to 10 minutes.

After etching, etch pits on the surface to be measured are observed using a Nomarski differential interference microscope. A value obtained by dividing the number of etch pits formed on the surface to be measured by the measurement area on the surface to be measured corresponds to the area density of threading screw dislocations 70. The observation field of view is, for example, 0.082 cm×0.070 cm. The measurement interval is, for example, 5 mm.

Figure 8:
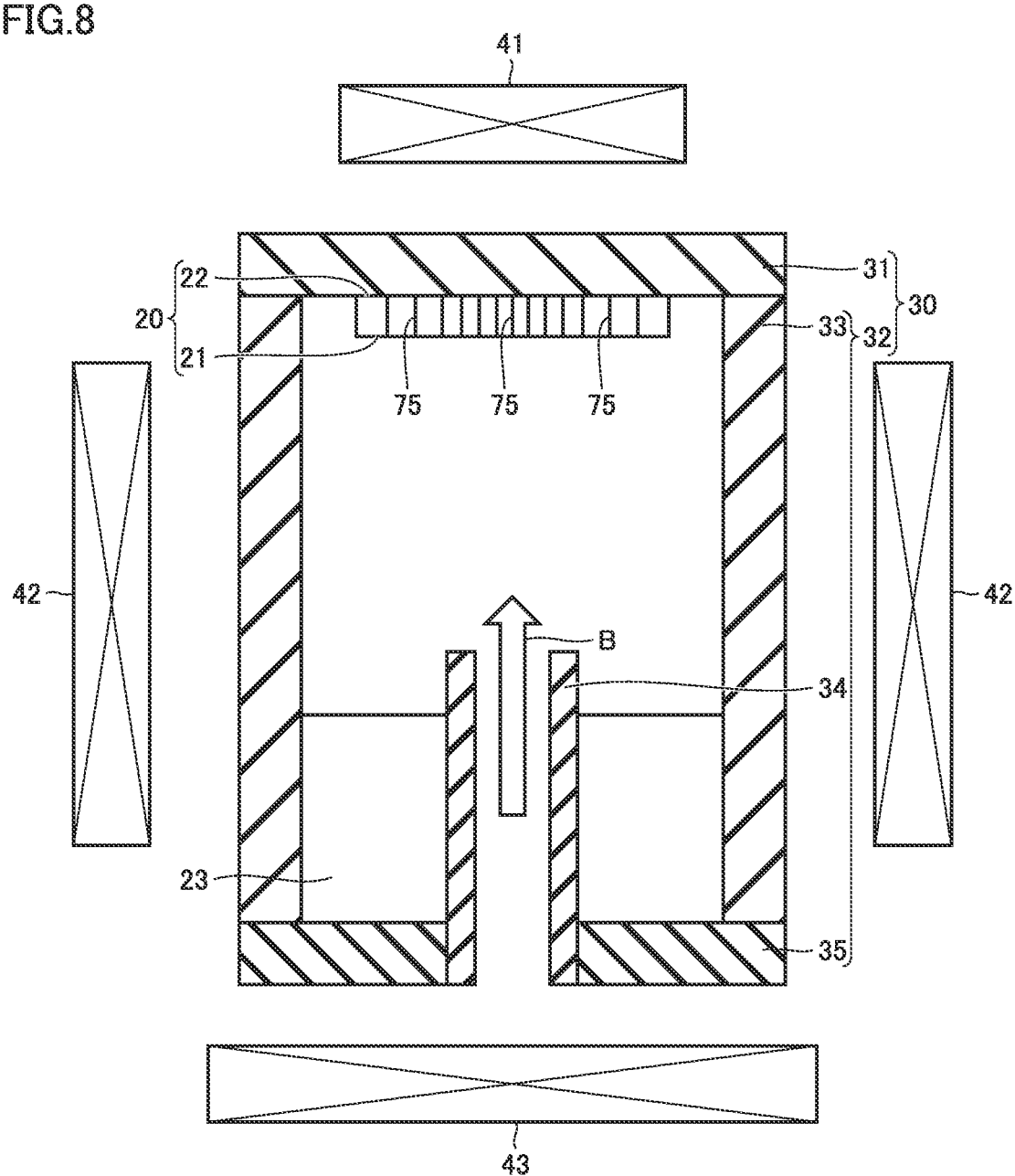
FIG. 8 is a partial schematic cross-sectional diagram showing a configuration of an apparatus for producing a silicon carbide single crystal according to an embodiment of the present disclosure.

Next, a configuration of an apparatus for producing silicon carbide single crystal according to the embodiment will be described. FIG. 8 is a partial schematic cross-sectional diagram showing the configuration of the apparatus for producing a silicon carbide single crystal according to the embodiment. As shown in FIG. 8, the apparatus for producing a silicon carbide single crystal mainly includes a crucible 30, a first resistive heater 41, a second resistive heater 42, and a third resistive heater 43. Crucible 30 has a source material containing part 32 and a lid part 31. Lid part 31 is disposed on source material containing part 32.

Source material containing part 32 includes a sidewall portion 33, a bottom wall portion 35, and a hollow tubular portion 34. Sidewall portion 33 has an annular shape. Bottom wall portion 35 is contiguous to sidewall portion 33. Hollow tubular portion 34 is disposed in a through hole provided in bottom wall portion 35. A silicon carbide source material 23 is disposed in a region inside sidewall portion 33 and outside hollow tubular portion 34.

First resistive heater 41 is disposed above lid part 31. Second resistive heater 42 is disposed to surround sidewall portion 33 of source material containing part 32. Third resistive heater 43 is disposed below bottom wall portion 35 of source material containing part 32. Hollow tubular portion 34 is disposed between third resistive heater 43 and lid part 31. Radiant heat B from third resistive heater 43 reaches the vicinity of the center of a silicon carbide seed substrate 20 through the interior of hollow tubular portion 34.

Next, a method for producing a silicon carbide single crystal according to the embodiment will be described. As shown in FIG. 8, silicon carbide source material 23 is disposed in source material containing part 32. Silicon carbide source material 23 is, for example, polycrystalline silicon carbide powder. Silicon carbide seed substrate 20 is fixed to lid part 31 using, for example, an adhesive (not shown). Silicon carbide seed substrate 20 has a growth surface 21 and a mounting surface 22. Mounting surface 22 is opposite to growth surface 21. Growth surface 21 faces silicon carbide source material 23. Mounting surface 22 faces lid part 31. An outer peripheral portion of growth surface 21 of silicon carbide seed substrate 20 is disposed to face a surface of silicon carbide source material 23. Hollow tubular portion 34 faces the central portion of growth surface 21.

Silicon carbide seed substrate 20 is, for example, a hexagonal silicon carbide substrate of polytype 4H. Growth surface 21 has a diameter of 150 mm, for example. Growth surface 21 may have a diameter of 150 mm or more. Growth surface 21 is the {0001} plane, or a plane inclined by an off angle of about 5° or less with respect to the {0001} plane, for example. Silicon carbide seed substrate 20 has a plurality of a fifth threading screw dislocations 75. Each of the plurality of fifth threading screw dislocations 75 may extend in a direction perpendicular to growth surface 21. As described above, silicon carbide seed substrate 20 and silicon carbide source material 23 are disposed in crucible 30.

Figure 9:
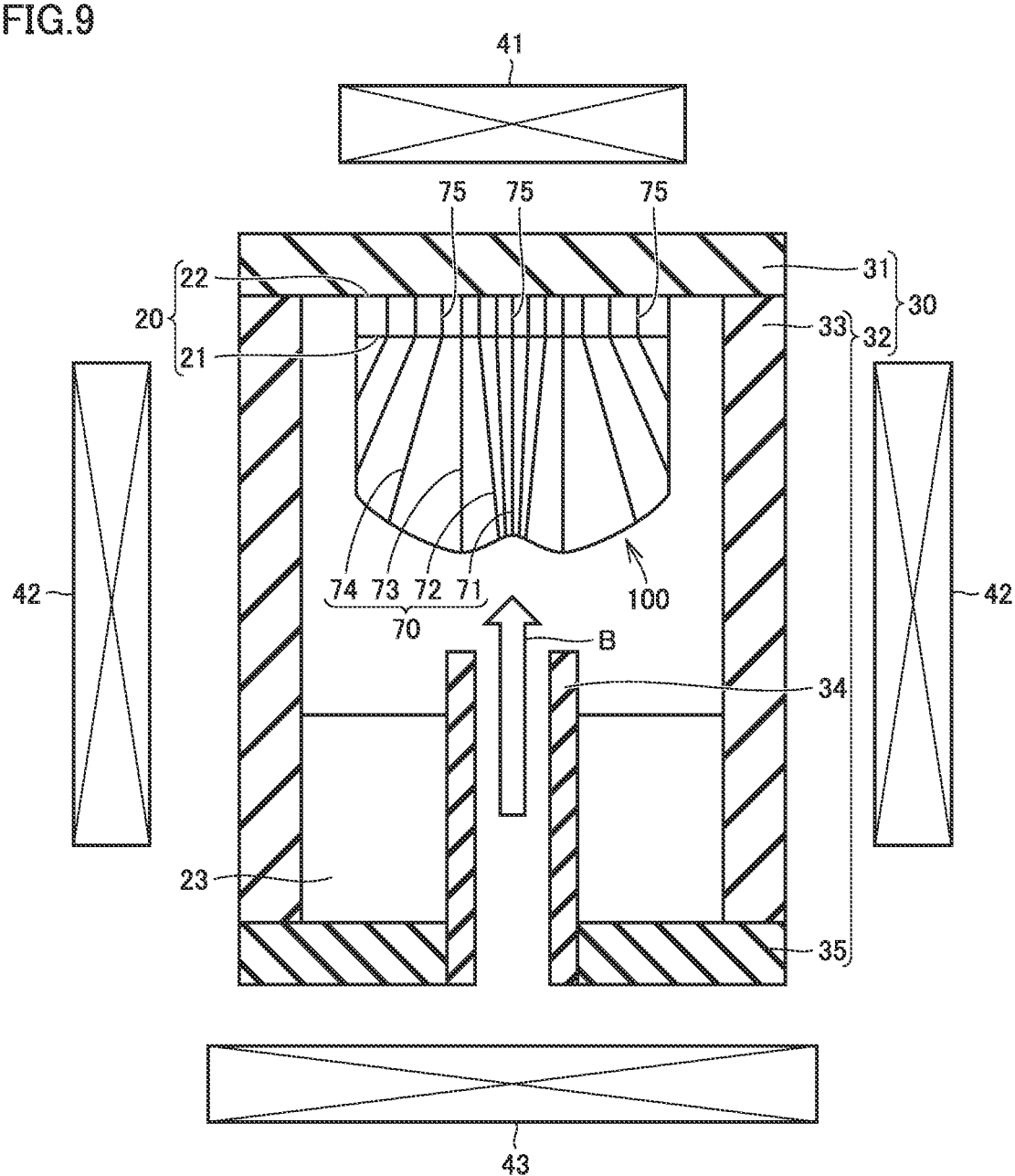
FIG. 9 is a partial schematic cross-sectional diagram showing a method for producing a silicon carbide single crystal.

FIG. 9 is a partial schematic cross-sectional diagram showing a method for producing a silicon carbide single crystal. First, crucible 30 is heated to a temperature of, for example, from 2100° C. to 2300° C. While the temperature of crucible 30 is increasing, the pressure of the atmospheric gas in crucible 30 is maintained at about the 80 kPa, for example. The atmospheric gas contains an inert gas such as argon gas, helium gas, or nitrogen gas.

Next, the pressure of the atmospheric gas in crucible 30 is depressurized to, for example, 1.0 kPa. As a result, silicon carbide source material 23 begins to sublimate and the sublimated silicon carbide gas recrystallizes on growth surface 21 of silicon carbide seed substrate 20. Silicon carbide single crystal 100 begins to grow on the growth surface of silicon carbide seed substrate 20. During the growth of silicon carbide single crystal 100, the pressure in crucible 30 is maintained at about from 0.1 kPa to 3 kPa, for example. The plurality of fifth threading screw dislocations 75 existing in silicon carbide seed substrate 20 are transferred to silicon carbide single crystal 100 to become a plurality of threading screw dislocations 70. The plurality of threading screw dislocations 70 include first threading screw dislocation 71, second threading screw dislocation 72, third threading screw dislocation 73, and fourth threading screw dislocation 74.

In the apparatus for producing a silicon carbide single crystal according to the embodiment, hollow tubular portion 34 is provided. Therefore, radiant heat from third resistive heater 43 is directly radiated to the central portion of the growth surface. As a result, the temperature of the central portion of the growth surface becomes higher than the temperature of the peripheral portion around the central portion. Therefore, the growth rate of silicon carbide single crystal 100 at the central portion of the growth surface is lower than the growth rate of silicon carbide single crystal 100 at the peripheral portion of the growth surface. As a result, silicon carbide single crystal 100 is grown in a state where the center of the growth surface (the surface closest to the source material) of silicon carbide single crystal 100 is recessed (see FIG. 9). Next, silicon carbide single crystal 100 is sliced along a plane perpendicular to the central axis of the silicon carbide single crystal. Thus, a plurality of silicon carbide substrates 10 are obtained (see FIG. 5).

Next, the function and effect of silicon carbide single crystal 100 and silicon carbide substrate 10 according to the embodiment will be described.

As a result of earnest studies on measures for reducing threading screw dislocations 70 while reducing stacking fault 5, the inventor has obtained the following findings and found silicon carbide single crystal 100, silicon carbide substrate 10, and methods for producing them according to the embodiment.

Threading screw dislocation 70 is easily extended along the growth direction of silicon carbide single crystal 100. In other words, threading screw dislocation 70 is easily extended in a direction perpendicular to the growth surface of silicon carbide single crystal 100. During crystal growth of silicon carbide single crystal 100, by intentionally recessing central region 24 of the growth surface of silicon carbide single crystal 100, the growth direction of silicon carbide single crystal 100 is inclined toward central region 24 of the growth surface of silicon carbide single crystal 100. As a result, threading screw dislocation 70 extends toward central region 24 of the growth surface of silicon carbide single crystal 100. That is, threading screw dislocations 70 are concentrated in central region 24 of the growth surface of silicon carbide single crystal 100.

As a result, threading screw dislocations 70 can be reduced in outer peripheral region 25 around central region 24 of the growth surface (second main surface 2) of silicon carbide single crystal 100. Therefore, it is possible to increase the area of the region of silicon carbide single crystal 100 in which the area density of threading screw dislocations 70 is low. Further, according to the above method, it is not necessary to actively convert threading screw dislocation 70 into stacking fault 5 by using a structure conversion layer. Therefore, it is possible to suppress an increase in the line density of stacking fault 5. Therefore, the yield of silicon carbide semiconductor devices manufactured using silicon carbide single crystal 100 can be improved.

According to silicon carbide single crystal 100 of the embodiment, middle cross-section 3 includes dense region 55 in which the area density of threading screw dislocations 70 is 2 or more times the overall average area density that is an average area density of threading screw dislocations 70 in middle cross-section 3, middle cross-section 3 being the cross-section perpendicular to the thickness direction of silicon carbide single crystal 100 and located midway between first main surface 1 and second main surface 2. The area of dense region 55 is 10% or less of the area of middle cross-section 3. The line density of stacking fault 5 in each of first cross-section 11 and second cross-section 12 is 1/cm or less, first cross-section 11 being the cross-section separated from first main surface 1 by a distance of 0.1 times the thickness of silicon carbide substrate 10 in the thickness direction, second cross-section 12 being a cross-section separated from second main surface 2 by a distance of 0.1 times the thickness of silicon carbide substrate 10 in the thickness direction. Thus, silicon carbide single crystal 100 in which the line density of stacking fault 5 is reduced and threading screw dislocations 70 is concentrated in dense region 55 is obtained. Therefore, the yield of the silicon carbide semiconductor device manufactured using silicon carbide single crystal 100 can be improved.

In silicon carbide substrate 10 according to an embodiment, third main surface 61 includes dense region 55 in which an area density of threading screw dislocations 70 is 2 or more times the overall average area density that is the average area density of threading screw dislocations 70 in third main surface 61. The area of dense region 55 is 10% or less of the area of third main surface 61. The line density of stacking fault 5 in third main surface 61 is 1/cm or less. Thus, silicon carbide substrate 10 in which the line density of stacking fault 5 is reduced and threading screw dislocations 70 is concentrated in dense region 55 is obtained. Therefore, the yield of the silicon carbide semiconductor device manufactured using silicon carbide substrate 10 can be improved.

EXAMPLES (Sample Preparation)

Silicon carbide single crystals 100 according to a sample 1 and a sample 2 were prepared. Silicon carbide single crystal 100 according to the sample 1 is a comparative example. Silicon carbide single crystal 100 according to the sample 2 is an example. Silicon carbide single crystal 100 according to the sample 2 was produced using the producing apparatus shown in FIG. 8. In the producing apparatus for producing silicon carbide single crystal 100 according to the sample 2, hollow tubular portion 34 is provided in bottom wall portion 35 of the crucible. On the other hand, silicon carbide single crystal 100 according to the sample 1 was produced using a conventional producing apparatus in which hollow tubular portion 34 was not provided in bottom wall portion 35 of the crucible. The producing conditions of silicon carbide single crystal 100 were as described above.

(Evaluation Method 1)

The line density of stacking fault 5 in first cross-section 11 of each of silicon carbide single crystals 100 according to the sample 1 and the sample 2 was measured using the photoluminescence imaging device (model number: PLI-200) manufactured by PHOTON Design Corporation. While moving silicon carbide single crystal 100 in a direction parallel to first cross-section 11, a photoluminescence image of first cross-section 11 was captured. Similarly, the line density of stacking fault 5 in second cross-section 12 of each of silicon carbide single crystals 100 according to the sample 1 and the sample 2 was measured. While moving silicon carbide single crystal 100 in a direction parallel to second cross-section 12, a photoluminescence image of second cross-section 12 was captured.

Stacking fault 5 was identified in the obtained photoluminescence image. A value obtained by dividing the total length of stacking faults 5 in first cross-section 11 by the area of first cross-section 11 was used as the line density of stacking fault 5 in first cross-section 11. Similarly, a value obtained by dividing the total length of stacking faults 5 in second cross-section 12 by the area of second cross-section 12 was used as the line density of stacking fault 5 in second cross-section 12.

Next, each of silicon carbide single crystals 100 according to the sample 1 and the sample 2 was cut by a wire saw. Thus, silicon carbide substrates 10 according to the sample 1 and the sample 2 were obtained. While moving silicon carbide substrate 10 in a direction parallel to third main surface 61, a photoluminescence image of third main surface 61 was captured. A value obtained by dividing the total length of stacking faults 5 in third main surface 61 of silicon carbide substrate 10 by the area of third main surface 61 was used as the line density of stacking fault 5 in third main surface 61. The off angle of third main surface 61 of each of silicon carbide substrates 10 according to the sample 1 and the sample 2 was set to 4°.

(Evaluation Result 1)

TABLE 1

| | Line Density of Stacking Fault in First Cross-Section of Silicon Carbide Single Crystal (/cm) | Line Density of Stacking Fault in Second Cross-Section of Silicon Carbide Single Crystal (/cm) | Line Density of Stacking Fault in Third Main Surface of Silicon Carbide Substrate (/cm) |
|---|---|---|---|
| Sample 1 | 0.8 | 0.2 | 0.9 |
| Sample 2 | 0.7 | 0.3 | 0.6 |

As shown in Table 1, the line densities of stacking fault 5 in first cross-section 11 and second cross-section 12 of silicon carbide single crystal 100 according to the sample 1 were 0.8/cm and 0.2/cm, respectively. The line density of stacking fault 5 in third main surface 61 of silicon carbide substrate 10 according to the sample 1 obtained by slicing silicon carbide substrate 10 according to the sample 1 was 0.9/cm.

The line densities of stacking fault 5 in first cross-section 11 and second cross-section 12 of silicon carbide substrate 10 according to the sample 2 were 0.7/cm and 0.3/cm, respectively. The line density of stacking fault 5 in third main surface 61 of silicon carbide substrate 10 according to the sample 2 obtained by slicing silicon carbide substrate 10 according to the sample 2 was 0.6/cm. From the above results, it was confirmed that the line density of stacking fault 5 in silicon carbide substrate 10 according to the sample 1 was about the same as the line density of stacking fault 5 in silicon carbide substrate 10 according to the sample 2.

(Evaluation Method 2)

Next, the area density distributions of threading screw dislocations 70 in third main surface 61 of silicon carbide substrate 10 according to the sample 1 and the sample 2 were measured using the molten KOH method. Specifically, third main surfaces 61 of silicon carbide substrates 10 according to the sample 1 and the sample 2 were etched by molten KOH. After third main surfaces 61 of silicon carbide substrates 10 were etched with molten KOH, etch pits originated from threading screw dislocations 70 were observed using a Nomarski differential interference microscope. An observation visual field for the etch pits was 0.082 cm×0.070 cm. Third main surface 61 of silicon carbide substrate 10 was divided into a plurality of square regions. The size of each of the plurality of square regions was 5 mm×5 mm. The number of etch pits in each of the plurality of square regions was determined. A value obtained by dividing the number of etch pits in the square region by the area (0.082 cm×0.070 cm) of the observation visual field for the etch pits was defined as an area density of threading screw dislocations 70 in that square region. A sum of the area densities of threading screw dislocations 70 in all square regions was divided by the number of square regions to obtain a value as the area density of threading screw dislocations 70 in third main surface 61 of silicon carbide substrate 10.

(Evaluation Result 2)

Figure 10:
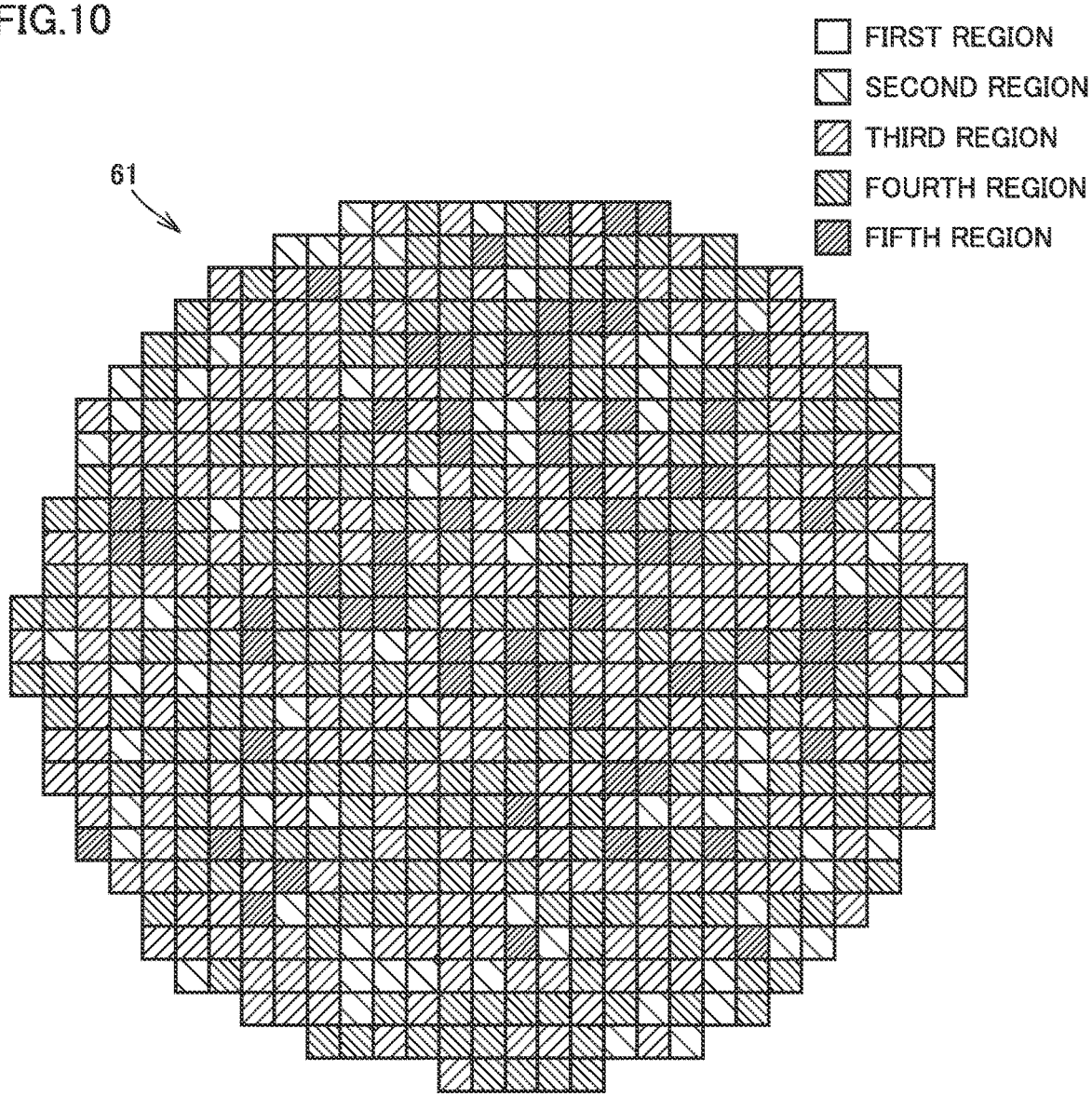
FIG. 10 is a schematic plan view showing area densities of threading screw dislocations in a plurality of square regions of a third main surface of a silicon carbide substrate according to sample 1.

FIG. 10 is a schematic plan view showing the area densities of threading screw dislocations 70 in a plurality of square regions of third main surface 61 of silicon carbide substrate 10 according to the sample 1. A first region is a region in which the area density of threading screw dislocations 70 is less than 520 cm$^2$. A second region is a region in which the area density of threading screw dislocations 70 is 520 cm$^2$ or more and less than 1040 cm$^{-2}$. A third region is a region in which the area density of threading screw dislocations 70 is 1040 cm$^2$ or more and less than 1560 cm$^2$. A fourth region is a region in which the area density of threading screw dislocations 70 is 1560 cm$^2$ or more and less than 2160 cm$^2$. A fifth region is a region in which the area density of threading screw dislocations 70 is 2160 cm$^2$ or more.

The average area density of threading screw dislocations 70 in third main surface 61 of silicon carbide substrate 10 according to the sample 1 is 1040 cm$^{-2}$. The average area density of threading screw dislocations 70 in annular region 57 of third main surface 61 is 1070 cm$^{-2}$. As shown in FIG. 10, threading screw dislocations 70 are evenly distributed on third main surface 61 of silicon carbide substrate 10 of the sample 1.

Figure 11:
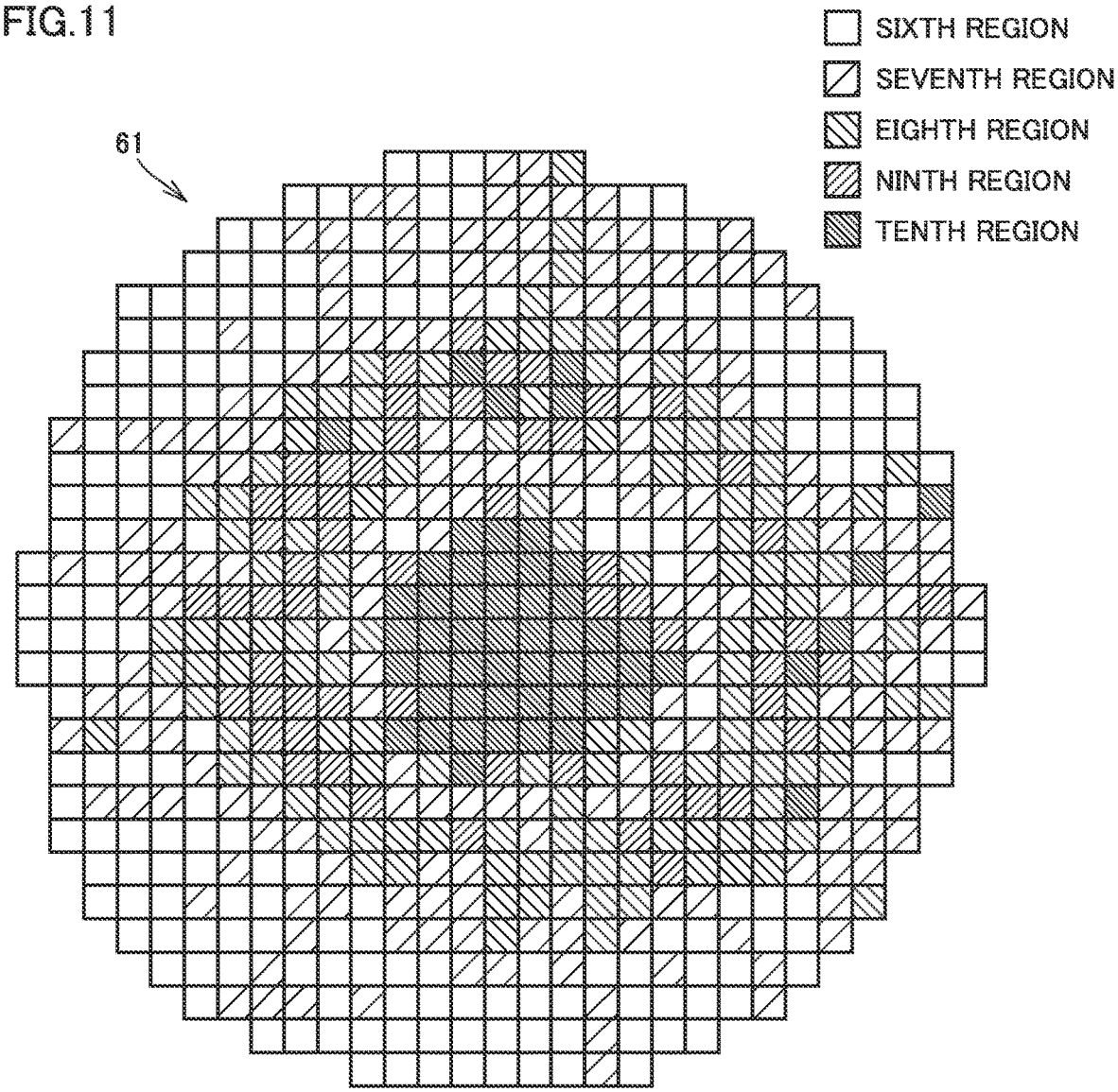
FIG. 11 is a schematic plan view showing area densities of threading screw dislocations in a plurality of square regions of a third main surface of a silicon carbide substrate according to sample 2.

FIG. 11 is a schematic plan view showing the area densities of threading screw dislocations 70 in a plurality of square regions of third main surface 61 of silicon carbide substrate 10 according to the sample 2. A sixth region is a region in which the area density of threading screw dislocations 70 is less than 410 cm$^{-2}$. A seventh region is a region in which the area density of threading screw dislocations 70 is 410 cm$^{-2}$ or more and less than 820 cm$^{-2}$. An eighth region is a region in which the area density of threading screw dislocations 70 is 820 cm$^{-2}$ or more and less than 1230 cm$^{-2}$. A ninth region is a region in which the area density of threading screw dislocations 70 is 1230 cm$^{-2}$ or more and less than 1640 cm$^{-2}$. A 10th region is a region in which the area density of threading screw dislocation 70 is 1640 cm$^{-2}$ or more.

The average area density of threading screw dislocations 70 in third main surface 61 of silicon carbide substrate 10 according to the sample 2 is 820 cm$^{-2}$. The average area density of threading screw dislocations 70 in annular region 57 of third main surface 61 is 1080 cm$^{-2}$. As shown in FIG. 11, in the vicinity of the center of third main surface 61 of silicon carbide substrate 10 according to the sample 2, regions having high area densities of threading screw dislocations 70 are concentrated. On the other hand, regions with low area densities of threading screw dislocations 70 are distributed around the outer periphery of third main surface 61.

Table 2 shows area ratios of threading screw dislocations 70 in third main surface 61 of silicon carbide substrate 10 according to the sample 1. The area ratio of a certain region is a value obtained by dividing a total area of the certain region by the entire area of third main surface 61. The first region is a region in which the area density of threading screw dislocations 70 is lower than half the average area density of threading screw dislocations 70 in third main surface 61. The fifth region is a region in which the area density of threading screw dislocations 70 is higher than twice the average area density of threading screw dislocation 70 in third main surface 61.

TABLE 2

| Region | Area Ratio (%) |
|---|---|
| First Region | 11 |
| Second Region | 38 |
| Third Region | 38 |
| Fourth Region | 10 |
| Fifth Region | 2 |

Table 3 shows area ratios of threading screw dislocations 70 in third main surface 61 of silicon carbide substrate 10 according to the sample 2. The sixth region is a region in which the area density of threading screw dislocations 70 is lower than half the average area density of threading screw dislocations 70 in third main surface 61. The 10th region is a region in which the area density of threading screw dislocations 70 is higher than twice the average area density of threading screw dislocation 70 in third main surface 61.

TABLE 3

| Region | Area Ratio (%) |
|---|---|
| Sixth Region | 31 |
| Seventh Region | 30 |
| Eighth Region | 20 |
| Ninth Region | 10 |
| Tenth Region | 9 |

When Table 2 and Table 3 are compared, the area ratio of the 10th region of silicon carbide substrate 10 according to the sample 2 is 4 or more times the area ratio of the fifth region of silicon carbide substrate 10 according to the sample 1. That is, in silicon carbide substrate 10 according to the sample 2, the area ratio of the region in which the area density of threading screw dislocations 70 is higher than twice the average area density of threading screw dislocations 70 in third main surface 61 is higher than that of silicon carbide substrate 10 according to the sample 1.

On the other hand, the area ratio of the sixth region of silicon carbide substrate 10 according to the sample 2 is 2 or more times the area ratio of the first region of silicon carbide substrate 10 according to the sample 1. That is, in silicon carbide substrate 10 according to the sample 2, the area ratio of the region in which the area density of threading screw dislocations 70 is lower than half of the average area density of threading screw dislocation 70 in third main surface 61 is higher than that of silicon carbide substrate 10 according to the sample 1. That is, in silicon carbide substrate 10 according to the sample 2, the area ratio of the region in which the area density of threading screw dislocations 70 is low can be increased compared to silicon carbide substrate 10 according to the sample 1.

It should be understood that the embodiments and examples disclosed herein are illustrative in all respects and are not restrictive. The scope of the present invention is defined not by the above description but by the claims, and is intended to include meanings equivalent to the claims and all modifications within the scope.

REFERENCE SIGNS LIST 1 first main surface, 2 second main surface, 3 middle cross-section, 4 outer peripheral surface, 5 stacking fault, 7 orientation flat portion, 8 arc-shaped portion, 10 silicon carbide substrate, 11 first cross-section, 12 second cross-section, 20 silicon carbide seed substrate, 21 growth surface, 22 mounting surface, 23 silicon carbide source material, 24 central region, 25 outer peripheral region, 30 crucible, 31 lid part, 32 source material containing part, 33 sidewall portion, 34 hollow tubular portion, 35 bottom wall portion, 41 first resistive heater, 42 second resistive heater, 43 third resistive heater, 51 first circle, 52 second circle, 53 third circle, 54 center, 55 dense region, 56 non-dense region, 57 annular region, 58 sparse density region, 61 third main surface (main surface), 62 fourth main surface, 63 peripheral edge surface, 70 threading screw dislocation, 71 first threading screw dislocation, 72 second threading screw dislocation, 73 third threading screw dislocation, 74 fourth threading screw dislocation, 75 fifth threading screw dislocation, 81 first boundary, 82 second boundary, 100 silicon carbide single crystal, 101 first direction, 102 second direction, 103 third direction, A1 first length, A2 second length, B radiant heat, C central axis, H1 first distance, H2 second distance, H3 third distance, H4 fourth thickness, H5 fifth thickness, W1 first diameter, W2 second diameter, W3 third diameter, W4 fourth diameter

The invention claimed is:

1. A silicon carbide single crystal comprising a first main surface, a second main surface opposite to the first main surface, and an outer peripheral surface contiguous to each of the first main surface and the second main surface,
    wherein a middle cross-section includes a dense region in which an area density of threading screw dislocations is 2 or more times an overall average area density that is an average area density of threading screw dislocations in the middle cross-section, the middle cross-section being a cross-section perpendicular to a thickness direction of the silicon carbide single crystal and located midway between a first boundary between the first main surface and the outer peripheral surface and a second boundary between the second main surface and the outer peripheral surface,
    an area of the dense region is 10% or less of an area of the middle cross-section,
    a line density of a stacking fault in each of a first cross-section and a second cross-section is 1/cm or less, the first cross-section being a cross-section separated from the first boundary toward the second boundary by a distance of 0.1 times a distance from the first boundary to the second boundary, the second cross-section being a cross-section separated from the second boundary toward the first boundary by a distance of 0.1 times the distance from the first boundary to the second boundary, the middle cross-section includes a sparse density region in which an area density of threading screw dislocations is lower than half the overall average area density, and an area of the sparse density region is 12% or more of the area of the middle cross-section.

2. The silicon carbide single crystal according to claim 1, wherein the dense region includes a center of the middle cross-section.

3. The silicon carbide single crystal according to claim 1, wherein the area of the sparse density region is 30% or more of the area of the middle cross-section.

4. The silicon carbide single crystal according to claim 1,
wherein the middle cross-section includes an annular region between a first circle having a diameter of 40% of a diameter of the middle cross-section and a second circle having a diameter of 60% of the diameter of the middle cross-section, each of a center of the first circle and a center of the second circle is identical to a center of the middle cross-section, and an average area density of threading screw dislocations in the annular region is 1.3 or more times the overall average area density.

5. The silicon carbide single crystal according to claim 1, wherein the middle cross-section has a diameter of 150 mm or more.

6. A silicon carbide substrate comprising a main surface,
wherein the main surface includes a dense region in which an area density of threading screw dislocations is 2 or more times an overall average area density that is an average area density of threading screw dislocations in the main surface, an area of the dense region is 10% or less of an area of the main surface, a line density of a stacking fault in the main surface is 1/cm or less, the main surface includes a sparse density region in which an area density of threading screw dislocations is lower than half the overall average area density, and an area of the sparse density region is 12% or more of the area of the main surface.

7. The silicon carbide substrate according to claim 6, wherein the dense region includes a center of the main surface.

8. The silicon carbide substrate according to claim 6, wherein the area of the sparse density region is 30% or more of the area of the main surface.

9. The silicon carbide substrate according to claim 6,
wherein the main surface includes an annular region between a first circle having a diameter of 40% of a diameter of the main surface and a second circle having a diameter of 60% of the diameter of the main surface, each of a center of the first circle and a center of the second circle is identical to a center of the main surface, and an average area density of threading screw dislocations in the annular region is 1.3 or more times the overall average area density.

10. The silicon carbide substrate according to claim 6, wherein the main surface has a diameter of 150 mm or more.

* * * * *